US010084591B1

(12) United States Patent
Palusa et al.

(10) Patent No.: US 10,084,591 B1
(45) Date of Patent: Sep. 25, 2018

(54) SERDES BUILT-IN SINUSOIDAL JITTER INJECTION

(71) Applicant: Oracle International Corporation, Redwood City, CA (US)

(72) Inventors: Chaitanya Palusa, Fremont, CA (US); Dawei Huang, San Diego, CA (US); Jiangyuan Li, San Jose, CA (US); Pradeep Nagarajan, San Jose, CA (US)

(73) Assignee: ORACLE INTERNATIONAL CORPORATION, Redwood City, CA (US)

(*) Notice: Subject to any disclaimer, the term of this patent is extended or adjusted under 35 U.S.C. 154(b) by 10 days.

(21) Appl. No.: 15/464,972

(22) Filed: Mar. 21, 2017

(51) Int. Cl.
*H04L 7/00* (2006.01)

(52) U.S. Cl.
CPC .................. *H04L 7/0025* (2013.01)

(58) Field of Classification Search
CPC ........... G06F 13/42; G06F 15/16; H03D 3/18; H03D 3/24; H03K 5/00; H03K 5/135; H04B 1/38; H04B 1/40; H04B 17/00; H04L 1/20; H04L 7/00; H04L 7/06; H04L 7/033; H04L 7/0025; H04L 25/00
USPC ....... 375/219, 355, 356, 371, 372; 455/67.1, 455/67.4, 115; 709/242, 248; 710/105
See application file for complete search history.

(56) References Cited

U.S. PATENT DOCUMENTS

| 2007/0038789 | A1* | 2/2007 | Macri | ......................... H03L 7/07 710/105 |
| 2007/0160173 | A1* | 7/2007 | Takeuchi | .............. H03L 7/0814 375/355 |
| 2008/0310569 | A1* | 12/2008 | Takeuchi | .............. H04L 7/0337 375/357 |
| 2009/0304054 | A1* | 12/2009 | Tonietto | .................. H04L 1/205 375/221 |
| 2014/0098843 | A1* | 4/2014 | Kong | ............... G01R 31/31709 375/219 |

\* cited by examiner

*Primary Examiner* — Shawkat M Ali
(74) *Attorney, Agent, or Firm* — Marsh Fischmann & Breyfogle LLP; Kent A. Lembke; Daniel J. Sherwinter

(57) ABSTRACT

Embodiments enable built-in sinusoidal jitter injection, for example, in a serializer/deserializer (SERDES) circuit. For example, embodiments can receive a tracking profile that corresponds to a predetermined sinusoidal jitter (SJ) profile and a predetermined phase interpolator (PI) profile. A shift determination can be made for each of a plurality of insertion times according to the tracking profile, the shift determination indicating whether to adjust phase interpolation of the SERDES circuit. At each of the plurality of insertion times, a phase adjustment signal can be generated as a function of the shift determination. For example, the phase adjustment signal can indicate a control code for a phase interpolator coupled to a clock generator of the SERDES, and the signal can be output to the phase interpolator. Some implementations adjust the phase interpolator in response to the phase adjustment signal, such that the phase interpolator injects SJ that substantially tracks the SJ profile.

19 Claims, 7 Drawing Sheets

| Int | PM(t) | Shift | s(t) | IM(t) | IM_UI(t) |
|---|---|---|---|---|---|
| 1 | 0.808080808 | 1 | 1 | 0.808080808 | 0.020833333 |
| 2 | 1.608379356 | 1 | 2 | 1.616161616 | 0.041666667 |
| 3 | 2.393188332 | 1 | 3 | 2.424242424 | 0.0625 |
| 4 | 3.154949596 | 1 | 4 | 3.232323232 | 0.083333333 |
| 5 | 3.88632697 | 1 | 5 | 4.04040404 | 0.104166667 |
| 6 | 4.580276892 | 1 | 6 | 4.848484848 | 0.125 |
| 7 | 5.230116243 | 0 | 6 | 4.848484848 | 0.125 |
| 8 | 5.829586715 | 1 | 7 | 5.656565657 | 0.145833333 |
| 9 | 6.372915081 | 1 | 8 | 6.464646465 | 0.166666667 |
| 10 | 6.854868791 | 0 | 8 | 6.464646465 | 0.166666667 |
| 11 | 7.270806367 | 1 | 9 | 7.272727273 | 0.1875 |
| 12 | 7.616722103 | 0 | 9 | 7.272727273 | 0.1875 |
| 13 | 7.889284641 | 1 | 10 | 8.080808081 | 0.208333333 |
| 14 | 8.085869056 | 0 | 10 | 8.080808081 | 0.208333333 |
| 15 | 8.204582131 | 0 | 10 | 8.080808081 | 0.208333333 |
| 16 | 8.244280596 | 0 | 10 | 8.080808081 | 0.208333333 |
| 17 | 8.204582131 | 0 | 10 | 8.080808081 | 0.208333333 |
| 18 | 8.085869056 | 0 | 10 | 8.080808081 | 0.208333333 |
| 19 | 7.889284641 | 0 | 10 | 8.080808081 | 0.208333333 |
| 20 | 7.616722103 | -1 | 9 | 7.272727273 | 0.1875 |
| 21 | 7.270806367 | 0 | 9 | 7.272727273 | 0.1875 |
| 22 | 6.854868791 | -1 | 8 | 6.464646465 | 0.166666667 |
| 23 | 6.372915081 | 0 | 8 | 6.464646465 | 0.166666667 |
| 24 | 5.829586715 | -1 | 7 | 5.656565657 | 0.145833333 |
| ... | ... | ... | ... | ... | ... |

FIG. 3

| SJ profiles | HF/MA 410 | HF/LA 420 | MF/HA 430 |
|---|---|---|---|
| Fbaud: Data Rate/Frequency (GHz) | 25.78125 | 25.78125 | 25.78125 |
| SPINT resolution | 0.020833333 | 0.020833333 | 0.020833333 |
| Step size (ps) | 0.808080808 | 0.808080808 | 0.808080808 |
| injection spacing (UI) | 16 | 32 | 16 |
| injection spacing (ps) | 620.6060606 | 1241.212121 | 620.6060606 |
| Fbaud/Fsj Ratio | 1024 | 1024 | 2048 |
| Fsj: SJ Frequency (MHz) | 25.17700195 | 25.17700195 | 12.58850098 |
| # of injection instances per SJ period | 64 | 32 | 128 |
| Min (non-zero) steps at each injection | 1 | 1 | 1 |
| A: SJ amplitue (UI) | 0.212547859 | 0.106788144 | 0.424583672 |

US 10,084,591 B1

SERDES BUILT-IN SINUSOIDAL JITTER INJECTION

FIELD

Embodiments relate generally to transceiver circuits, and, more particularly, to techniques for built-in sinusoidal jitter injection in serializer/deserializer (SERDES) circuits.

BACKGROUND

Many integrated circuits have signal lanes that support transmission and/or receipt of data signals. Those signal lanes can include circuitry (e.g., serializer/deserializer, or SERDES, circuits) to prepare bit data for transmission and/or to recover bit data after receipt. A standard figure of merit (FoM) for such circuitry is margin. For example, a larger margin measurement can indicate that the circuit is more tolerant of jitter and/or other non-idealities that can impact reliable recovery of data received over a channel. Sinusoidal jitter tolerance (SJT) testing is an industry standard measure of inherent margin inside the SERDES as it relates to clock data recovery (CDR). Typically, sinusoidal jitter tolerance involves injection of sinusoidal jitter into the data path using laboratory test equipment to determine the tolerance of the SERDES to that injected jitter (e.g., by monitoring the ability of the SERDES to track the injected jitter, etc.). While use of such test equipment tends to be effective, they tend to have various limitations. For example, such test equipment is often very expensive, unavailable in operational contexts (e.g., outside the context of a test lab), and tend only to measure margins relating to the particular test environment (e.g., they cannot accurately account for additional non-idealities of the system environment in which the circuits will be deployed).

BRIEF SUMMARY

Among other things, embodiments provide novel systems and methods for implementing built-in sinusoidal jitter injection. Some embodiments operate in context of a serializer/deserializer (SERDES) circuit. For example, embodiments can receive a tracking profile that corresponds to a predetermined sinusoidal jitter (SJ) profile and a predetermined phase interpolator (PI) profile. A shift determination can be made for each of a plurality of insertion times according to the tracking profile, the shift determination indicating whether to adjust phase interpolation of the SERDES circuit. At each of the plurality of insertion times, a phase adjustment signal can be generated as a function of the shift determination. For example, the phase adjustment signal can indicate (e.g., include, indicate to increment or decrement, etc.) a control code for a phase interpolator coupled to a clock generator of the SERDES, and the signal can be output to the phase interpolator. Some implementations adjust the phase interpolator in response to the phase adjustment signal, such that the phase interpolator injects SJ that substantially tracks the SJ profile.

BRIEF DESCRIPTION OF THE DRAWINGS

The present disclosure is described in conjunction with the appended figures:

FIG. 3 shows an illustrative portion of a sinusoidal jitter (SJ) profile, according to various embodiments;

Figure 1:
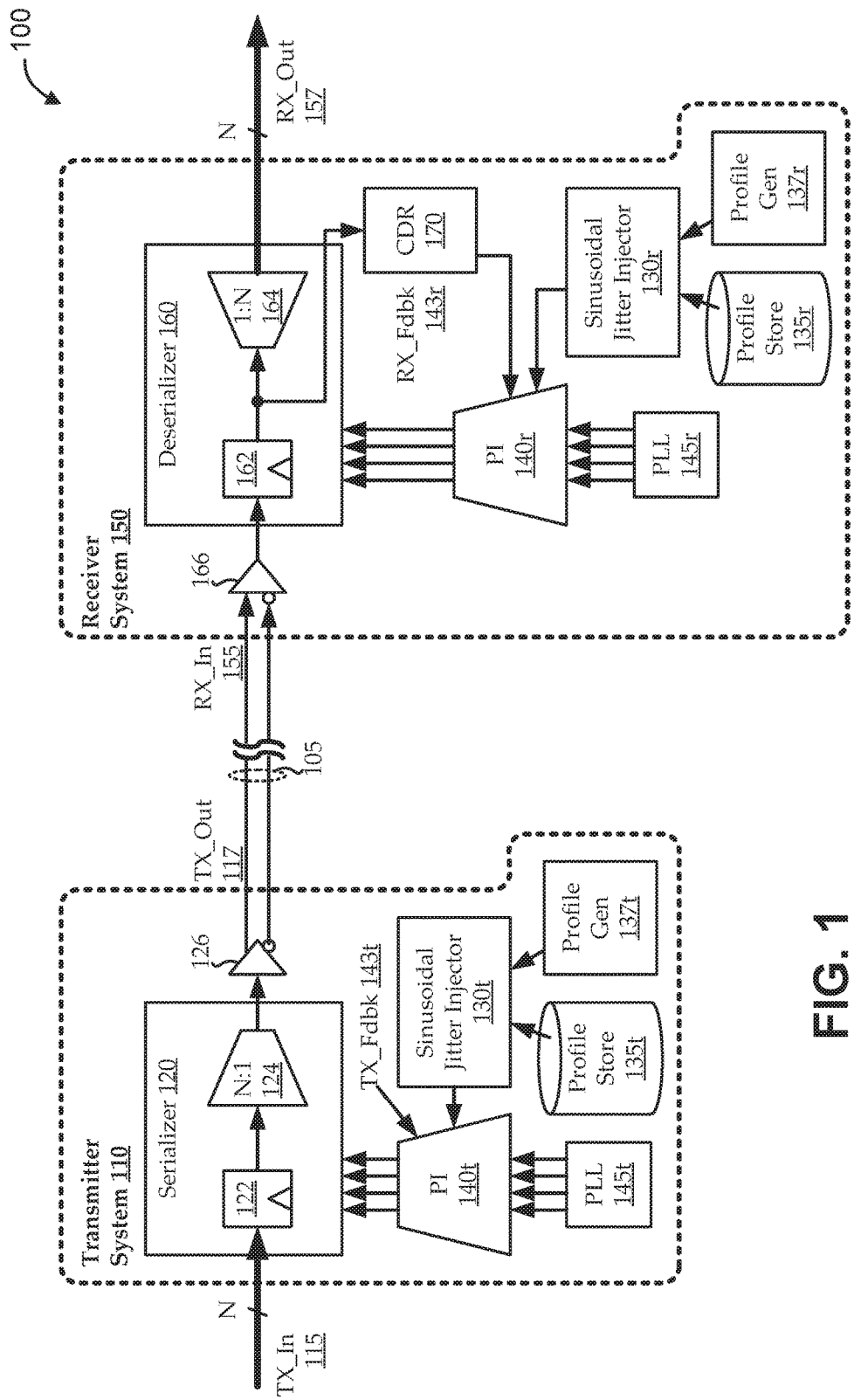
FIG. 1 shows a block diagram of an illustrative serial link communications system, according to various embodiments.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Margin is a standard figure of merit (FoM) for indicating how well a serializer/deserializer (SERDES) circuit is expected to perform under non-ideal (e.g., real-world) channel conditions. Sinusoidal jitter tolerance (SJT) testing is an industry standard measure of inherent margin inside the SERDES as it relates to clock data recovery (CDR). Conventionally, sinusoidal jitter (SJ) injection and testing has been implemented using high-end, expensive equipment in a laboratory setting. While use of such test equipment tends to be effective, they tend to have various limitations. For example, such test equipment is often very expensive, unavailable in operational contexts (e.g., outside the context of a test lab), and tend only to measure margins relating to the particular test environment (e.g., they cannot accurately account for additional non-idealities of the system environment in which the circuits will be deployed).

Embodiments described herein include novel techniques for implementing built-in SJ injection in SERDES circuits. Embodiments implement the SJ injection with novel use of standard SERDES building blocks. Some implementations include configurable generation of jitter with different SJ profiles, and/or other characteristics. Building such capability into the SERDES can facilitate SJ injection and testing in system environments after deployment of the SERDES. For example, the built-in capability can permit measurement of SJT in context of other non-idealities of the environment in which the SERDES is operating to measure operating margins, tune links for better performance, etc. Further, the built-in capability can facilitate use within manufacturing environments (e.g., using automated test equipment in a test lab) to introduce stress and screen parts with strong margins, etc. Even further, such built-in capability can facilitate its use for debugging and diagnostics. For example, SJ injection can be used as part of a tuning methodology for finding optimal margins for a SERDES circuit (e.g., by tuning parameters of a decision feedback equalizer (DFE), a continuous time linear equalizer (CTLE), transmitter finite impulse response (FIR) filter, etc.).

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

FIG. 1 shows a block diagram of an illustrative communications system 100, according to various embodiments. The communications system 100 includes a transmitter system 110 and a receiver system 150 in communication via a data channel 105. For example, a transmit data input signal 115 (e.g., a digital signal with N parallel data paths) is received by the transmitter system 110, which processes the signal and outputs a transmit data output signal 117 (e.g., a differential, serialized analog signal); the transmit data output signal 117 is received by the receiver system 150 via the data channel 105 as a receive data input signal 155, and the receiver system 150 processes the receive data input signal 155 to output a receive data output signal 157 (e.g., a digital signal with N parallel data paths that substantially corresponds to the transmit data input signal 115). The specific transmitter system 110 and receiver system 150 architectures and components in FIG. 1 are intended only to be illustrative, and should not be construed as limiting the scope of inventions described herein.

The transmitter system 110 includes a serializer 120 that is represented by a simplified circuit diagram as a latch 122 and a de-multiplexer 124. The latch 122 can effectively buffer the received data, and the de-multiplexer 124 can effectively serialize the data from N paths to one path. Typically, the transmitter system 110 will include additional components, such as filters (e.g., a finite impulse response (FIR) filter), amplifiers, etc. The serializer 120 receives a parallel transmit data input signal 115 having N data paths and outputs a single-path (serialized) data signal to an output buffer 126. The output buffer 126 outputs the serialized data signal as a differential analog signal (transmit data output signal 117). The serializer 120 operates according to a clock, which can be driven by a transmitter-side phase-locked loop (PLL) 145t, and/or any other suitable clocking components.

The receiver system 150 includes a deserializer 160 that is represented by a simplified circuit diagram as a latch 162 and a multiplexer 164. Typically, the transmitter system 110 will include additional components, such as filters, equalizers, amplifiers, etc. An input buffer 166 receives the receive data input signal 155 and passes the signal to the deserializer 160. In the deserializer 160, the latch 162 can effectifely buffer the received data, and the multiplexer 164 can effectively deserialize the data from one path to N paths. Accordingly, the deserializer 120 receives a serial transmit data input signal 115 having one data path and outputs a deserialized (parallel) data signal having N data paths. Like the serializer 120, the deserializer 160 operates according to a clock, which can be driven by a receiver-side PLL 145r, and/or any other suitable clocking components. In some implementations, the PLL 145t and the PLL 145r can be the same component, driven by a common PLL, or implemented in any other suitable manner.

Typically, feedback loops are included in the clock path on the transmitter and receiver sides in an attempt to compensate for certain non-idealities relating to the communication system 100. For example, transmission line characteristics of the data channel 105 and/or other operating and environmental conditions can cause inter-symbol interference in the data paths, reduce operational margins, and/or can otherwise reduce effectiveness of data recovery. The feedback loops can attempt to detect such conditions and can cause components of the communications system 100 to adapt, accordingly. On the transmitter side, the feedback loop can include a transmitter-side phase interpolator (PI) 140t that adjusts clock phase of the transmitter clock (PLL 145t) in response to a transmit feedback signal 143t. For example, the transmit feedback signal 143t indicates whether to increment or decrement a code in the PI 140t, thereby shifting the transmitter clock signal left or right. On the receiver side, the feedback loop can include a receiver-side phase interpolator (PI) 140r that adjusts clock phase of the receiver clock (PLL 145r) in response to a receive feedback signal 143r. For example, the receive feedback signal 143r indicates whether to increment or decrement a code in the PI 140r, thereby shifting the receiver clock signal early or late (e.g., left or right). As illustrated, in some implementations, the receive feedback signal 143r can be (or can include) output from a clock data recovery (CDR) circuit 170. In some implementations, the PLL 145 outputs a four-phase clock signal (e.g., the clock signal at 0, 90, 180, and 270 degrees), and the PI 140 generates four phase output clocks that are shifted in phase based on a control code input, or other input signal.

Even with feedback adaptation at the transmitter and receiver, the clock paths can exhibit jitter. For example, noise from power supplies and/or other components can generate jitter in the clock signals, and the jitter can consist of one or more frequencies of such noise. Typically, such jitter can be modeled as one or more sinusoidal components having different amplitudes and frequencies, in addition to random jitter. Such sinusoidal jitter can reduce margins and impact performance, accordingly. For the sake of background, sinusoidal jitter concepts are described in their relevant mathematical context. An ideal clock can be defined by the following equation in which Fbaud stands for the frequency corresponding to the data rate, t stands for time, and sgn represents a function that converts a sine wave to a square wave:

$$\text{sgn}[\sin(2*\pi*Fbaud*t)]$$

The above equation can be modified to define a clock with sinusoidal jitter as follows, where A and Fsj stand for amplitude and frequency for the sinusoidal jitter:

$$\text{sgn}[\sin(2*\pi*Fbaud*t+2*\pi*A*\sin(2*\pi*Fsj*t))]$$

The sinusoidal jitter component of the clock can be defined by the equation below:

$$SJ \text{ (in radians)}=2*\pi*A*\sin(2*\pi*Fsj*t)$$

The sinusoidal jitter can also be expressed in terms of a clock unit interval (UI), as shown below:

$$SJ \text{ (in UI)}=A*\sin(2*\pi*Fsj*t)$$

As described above, the sinusoidal jitter can reduce margins and impact performance of the transmitter system 110 and the receiver system 150. As such, test equipment is typically used to inject jitter into a SERDES, or the like, to test the ability of the transmitter and receiver systems to track the jitter as a measure of margin in a laboratory environment. However, such testing is typically limited. For example, the test equipment tends to be expensive; the testing tends only to be available in a laboratory environment, which may not correspond to real-world operational conditions; etc.

Embodiments described herein include novel techniques for injecting sinusoidal jitter into the transmitter system 110 and/or the receiver system 150 using built-in components. Some embodiments use components that are standard in SERDES circuits, and the like, but include novel uses of those components to provide the features described herein. For example, as described above, a PI 140 is typically used by the transmitter system 110 and/or the receiver system 150 to adapt to non-idealities in the data channel 105 and/or other conditions. Embodiments described herein drive the PI 140 on the transmitter and/or receiver sides of the communications system 100 to effectively force phase movement of the clock signal in a manner that mimics movement caused by sinusoidal jitter (e.g., RJ). By using built-in components to inject sinusoidal jitter, sinusoidal jitter testing can be performed without expensive test equipment and under laboratory and operational environments.

Figure 8:
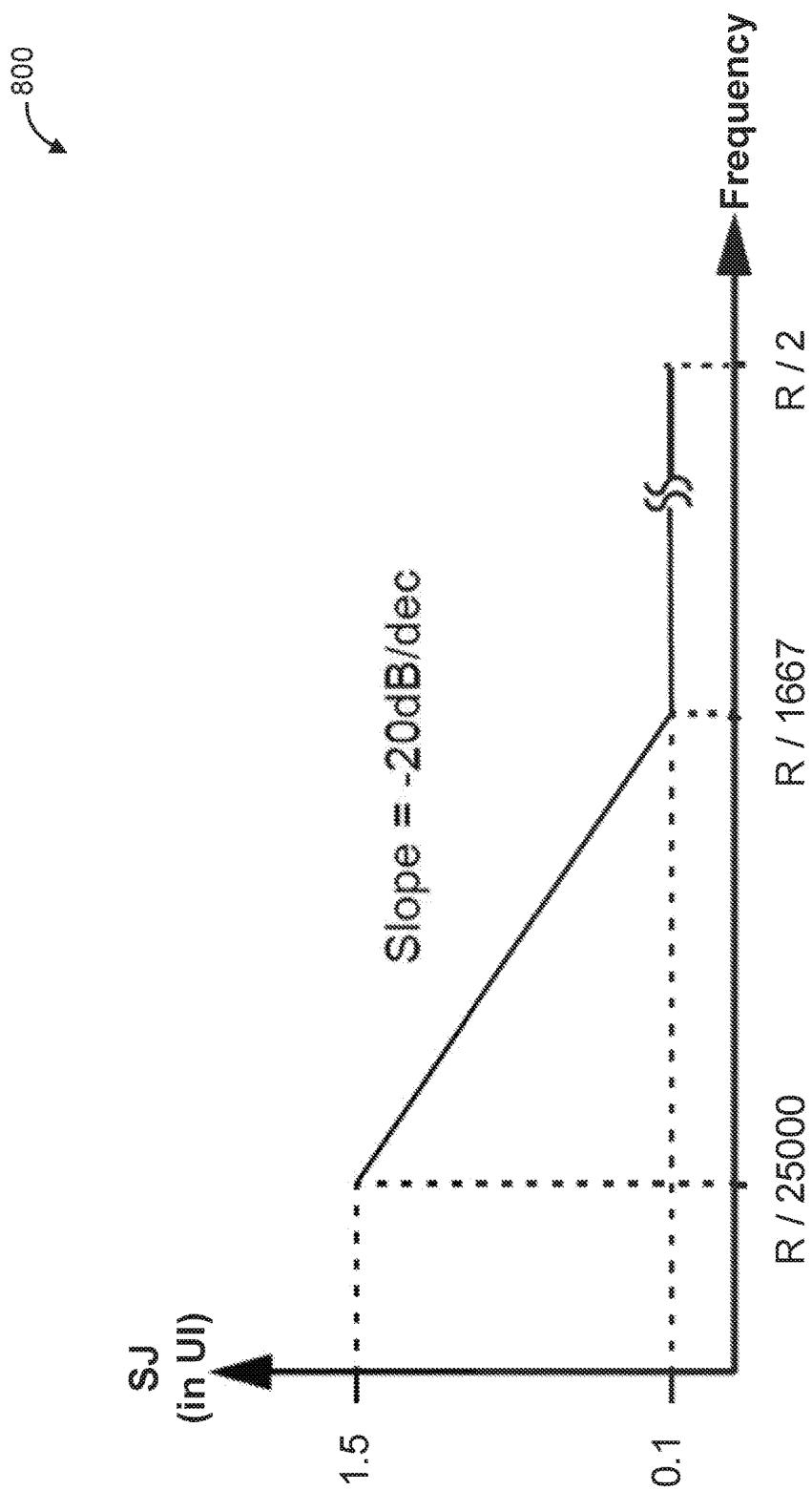

Many SERDES circuits are designed to comply with a defined industry standard or specification, which can typically include a sinusoidal jitter tolerance mask. FIG. 8 shows an illustrative jitter tolerance mask 800 that can be included in such a specification. As illustrated, the mask can indicate a minimum tolerable SJ (in clock unit intervals) over a range of frequencies. The frequencies can be expressed as a fraction of an operating signaling rate (R) (e.g., at a signaling rate of 2.5 GHz, the indicated X-axis values of the tolerance mask 800 would be at 100 KHz, 1.5 MHz, and 1.25 GHz). Compliance with such a specification can involve showing (e.g., by testing) that the jitter tolerance performance of the receiver of the SERDES is above that of the specified jitter tolerance mask. When the frequency of the sinusoidal jitter is low, a CDR 170 in the SERDES receiver system 150 is expected to track a relatively high amplitude of jitter. However, as the frequency of SJ increases, the SERDES CDR 170 will not be able to track the SJ beyond a certain point; and, as such, can only tolerate a small amplitude of jitter at higher frequencies. Some embodiments described herein can effectively inject sinusoidal jitter of one or more appropriate frequencies and amplitudes, which can characterize the SERDES jitter tracking performance and testing to a specified jitter tolerance mask.

Returning to FIG. 1, as illustrated, the transmitter system 110 can include a transmitter-side sinusoidal jitter injector 130t and/or the receiver system 150 can include a receiver-side sinusoidal jitter injector 130r. Embodiments of the sinusoidal jitter injector 130 output a signal that adjusts the PI(s) 140, thereby effectively modulating the clock signals coming from the PLL(s) 145 in a manner that is consistent with the above equations. Implementations of the sinusoidal jitter injector 130 can operate according to SERDES feedback control logic. For example, some conventional SERDES circuits include CDRs 170 and/or other feedback components that output control signals for incrementing or decrementing a code for, and/or otherwise controlling operation of, the PI(s) 140. The illustrated embodiment of the receiver system 150 shows a receiver-side PI 140r. The PI 140r can receive control commands both from the CDR 170 and from the sinusoidal jitter injector 130r. Alternatively, some implementations include an additional component that combines the output of the CDR 170 with the output of the sinusoidal jitter injector 130r to generate a single control signal for a single PI 140r.

Some embodiments of the sinusoidal jitter injector 130 include a profile store 135 that stores one or more jitter profiles. The sinusoidal jitter injected by the sinusoidal jitter injector 130 can be selected from a set of predefined profiles, each corresponding to a different amplitude and frequency combination. For example, a particular stored profile may be configured to generate jitter of one particular frequency at one particular amplitude, or of a combination of one or more frequencies at one or more amplitudes. The profile store 135 can be implemented as a look up table, or in any other suitable manner. In some implementations, each profile in the profile store 135 indicates a sequence of periodic shifts (e.g., increment, decrement, or stay the same) that are consistent with a desired sinusoidal jitter profile. Over a set of insertion times (e.g., periodic time increments), the sinusoidal jitter injector 130 can cycle periodically through the shift determinations, outputting a corresponding control signal to the PI 140. The control signal causes the output of the PI 140 to correspond to the stored jitter profile.

The sequence of shift results (e.g., increment, decrement, or keep the same; positive integer, negative integer, or zero; etc.) can be stored as a predefined SJ profile in the profile store 135. Additionally or alternatively, embodiments can include a profile generator 137 (e.g., a transmitter-side profile generator 137t and/or a receiver-side profile generator 137r). Embodiments of the profile generator 137 can generate the SJ profiles (e.g., in real-time, on demand, etc.) according to input parameters. Some embodiments permit hardware and/or software control of the input parameters. For example, hardware controls can be used to set sinusoidal jitter profile parameters, such as amplitude(s) and frequency(ies); to set phase interpolator profile parameters, such as step size; and/or to set other parameters, such as insertion time increment, PLL frequency, etc. Some such embodiments of the profile generator 137 are implemented as a state machine that generates each next shift control decision based on the input parameters and the previously generated decision or decisions.

Some SJ profile embodiments are generated by computing shift determinations (e.g., whether to shift the clock phases left, right, or not at all) for one entire sinusoidal period as described above. Other embodiments compute shift determinations for a quarter- or half-period as described above, and exploit sinusoidal symmetry to compute the remaining shift determinations. For example, one implementation of the profile store 135 stores an entire period of shift determinations for each SJ profile. Another implementation of the profile store 135 stores only a quarter-period of shift determinations for each SJ profile, and the sinusoidal jitter injector 130 includes components for translating (e.g., mirroring) the stored profile data, as needed. Similarly, one implementation of the profile generator 137 computes a shift determination for each insertion time. Another implementation of the profile generator 137 computes shift determinations for one period, after which the profile generator 137 or the sinusoidal jitter injector 130 can cycle through the computed results for further periods. Another implementation of the profile generator 137 computes shift determinations for one quarter-period, after which the profile generator 137 or the sinusoidal jitter injector 130 can mirror and cycle through the computed results for further quarter-periods.

Figure 2:
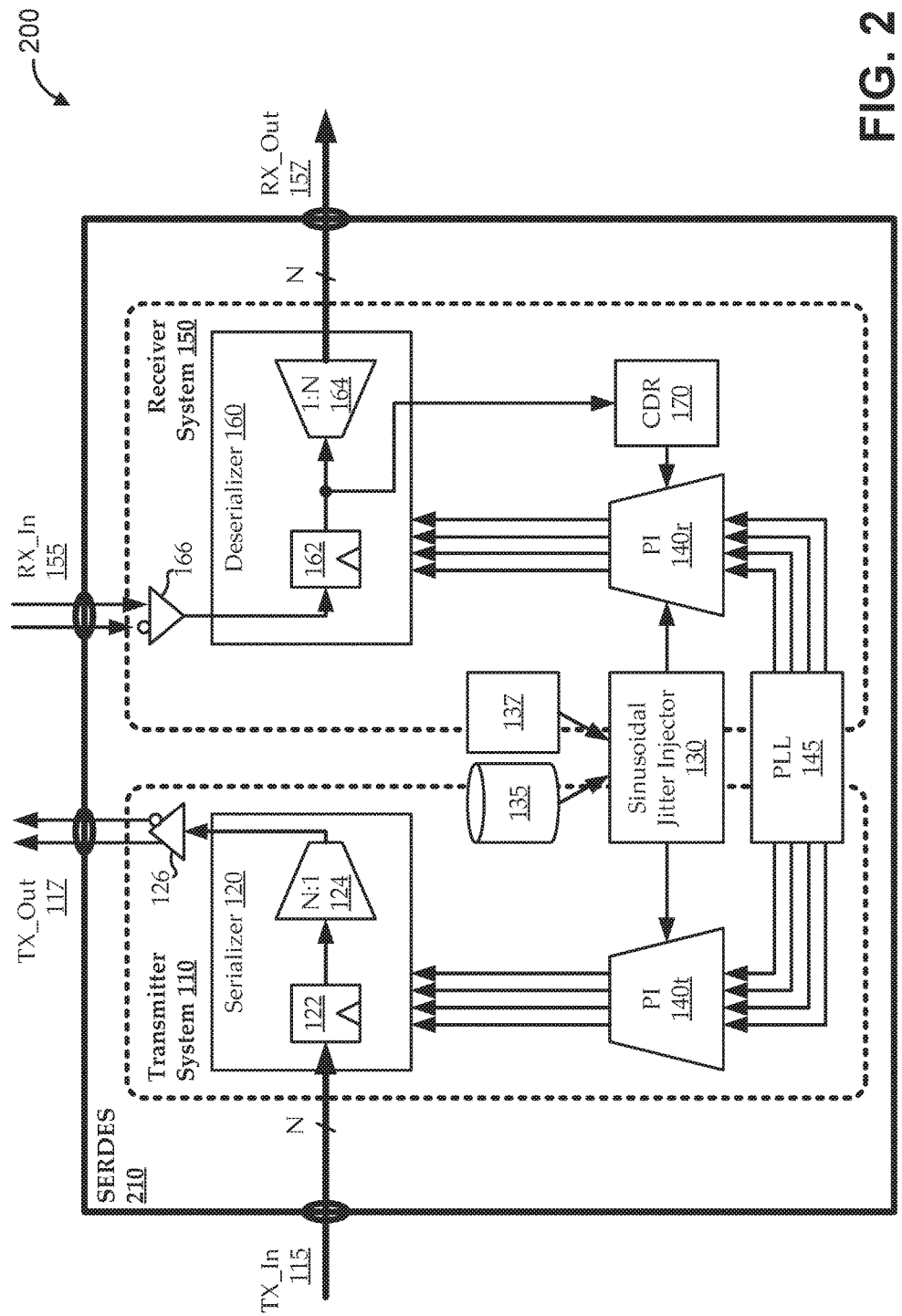
FIG. 2 shows a block diagram of a serializer/deserializer (SERDES) circuit, according to various embodiments.

FIG. 2 shows a block diagram of a serializer/deserializer (SERDES) circuit 200, according to various embodiments. In some embodiments, a processor or other integrated circuit includes multiple transmit/receive (Tx/Rx) circuits that can be coupled with multiple data channels. Some modern integrated circuits include hundreds of Tx/Rx circuits that can be coupled with hundreds of data channels. In some integrated circuits, some or all of the Tx/Rx circuits can include a SERDES, such that there may be hundreds of instances of the SERDES 200 on a single processor. Each SERDES 200 can include a transmitter system 110 and a receiver system 150. As described with reference to FIG. 1, the transmitter system 110 can receive a parallel digital data stream as a transmit data input signal 115 and can generate a serialized analog transmit data output signal 117 for transmission over a data channel. The receiver system 150 can receive a serialized analog receive data input signal 155 from a data channel and can generate a parallel digital data stream as a receive data output signal 157.

Embodiments of the transmitter system 110 and the receiver system 150 can operate as described above with reference to FIG. 1. For example, the transmitter system 110 of FIG. 1 can be implemented as the transmitter system 110 of a first SERDES 200 at a first side of a data channel, and the receiver system 150 of FIG. 1 can be implemented as the receiver system 150 of a second SERDES 200 at a second side of the data channel. As shown, embodiments of the SERDES 200 can share certain components between the transmitter system 110 and the receiver system 150. For example, a common PLL 145 can be used to generate both the transmit and receive clocks (e.g., four-phase clock signals) for use by both the transmit and receive sides of the SERDES 200. Embodiments can also include a shared sinusoidal jitter injector 130. In various implementations, the sinusoidal jitter injector 130 can be coupled with the receiver system 150, coupled with the transmitter system 110, selectively coupled with one of the receiver system 150 or the transmitter system 110 (e.g., according to a control signal, programmable switch, etc.), concurrently coupled with both the receiver system 150 and the transmitter system 110, etc. Accordingly, the sinusoidal jitter injector 130 can use SJ profiles to generate control signals for effectively injecting sinusoidal jitter into the transmit and/or receive clocks. As described above, the SJ profiles can be pre-computed and stored in a profile store 135, computed by a profile generator 137, and/or otherwise provided to the sinusoidal jitter injector 130.

As described with reference to FIG. 1, the SJ profiles can be defined as a sequence of shift results (e.g., determinations, for each of a number of insertion times, whether to shift the clock phase right, left, or not at all). The sequence of periodic shifts can be generated in accordance with the equations described above. At each insertion time, a sinusoidal jitter (SJ) profile and a phase interpolator (PI) profile can be used to determine whether to adjust phase interpolation. For example, the SJ profile includes at least one SJ profile amplitude and SJ profile frequency that effectively define the sinusoidal jitter; and the PI profile can include a PI step size and/or any other characteristics of the PI that can impact transformation of the SJ profile into shift controls for the PI 140. For each insertion time (e.g., a sequence of time increments), a value (e.g., a SJ profile magnitude) can be computed for the SJ at the particular insertion time as a function of the SJ profile amplitude and the SJ profile frequency. For example, as described above, the SJ profile magnitude can be computed as: PM(t)=A*sin(2π*F*t), where PM(t) is the SJ profile magnitude for the insertion time (t), A is the SJ profile amplitude, and F is the SJ profile frequency. For each insertion time, a SJ introduced magnitude can also be computed as a function of the PI step size and an accumulated PI steps at the immediately preceding insertion time (t−1). For example, the Si introduced magnitude can be computed as: IM(t−1)=S*s(t−1), where IM(t−1) is the SJ introduced magnitude, S is the PI step size, and s(t−1) is the accumulated PI steps at the immediately preceding insertion time (t−1). For each insertion time, embodiments can then determine whether to increase or decrease phase interpolation (e.g., whether to increment, decrement, or maintain the same PI 140 control code). Implementations can increase the phase interpolation when PM(t) exceeds IM(t−1) by at least an increase threshold according to the tracking profile, and implementations can decrease the phase interpolation when IM(t−1) exceeds PM(t) by at least a decrease threshold according to the tracking profile. For example, implementations can round [PM(t)−IM(t−1)]/S to a nearest integer, which can result in a positive integer (e.g., +1, +2, etc.), a negative integer (e.g., −1, −2, etc.), or a zero. In such an implementation, the phase interpolation can be increased when the result (the rounded nearest integer) is positive, and the phase interpolation be decreased when the result is negative.

FIG. 3 shows an illustrative portion of a sinusoidal jitter (SJ) profile 300, according to various embodiments. The illustrated SJ profile 300 includes six columns: "Int" represents the insertion time index; "PM(t)" represents the SJ profile magnitude for insertion time (t) in picoseconds; "Shift" represents the shift determination for insertion time (t); "s(t)" represents the accumulated PI steps as of insertion time (t); "IM(t)" is the SJ introduced magnitude as of insertion time (t) in picoseconds; and "IM_UI(t)" is the SJ introduced magnitude as of insertion time (t) in PLL clock unit intervals (UI). The illustrated SJ profile 300 is computed based on a SJ profile frequency of 25.17700195 MHz, a SJ profile amplitude of 0.212547859 UI, and a PI resolution of 0.020833333 (corresponding to a step size of 0.808080808 picoseconds at a data rate of 25.78125 GHz). While the SJ profile 300 is represented by a number of columns of data, various implementations can include any suitable portion of the illustrated data and/or other suitable data. For example, the SJ profile 300 may be stored only as the column of data labeled "Shift." Further, as described above, some implementations can store only a quarter-period of data. The illustrated SJ profile 300 is computed with 64 steps per sinusoidal period, so that a quarter-period can be represented by the data for insertion interval indices 1 to 16. For example, as illustrated, insertion time indices 17, 18, and 19 are identical to insertion time indices 15, 14, and 13, respectively, because of the sinusoidal symmetry around index 16.

The illustrated SJ profile 300 is computed based on a data rate (DR) of 25.78125 GHz, a SJ profile frequency of 25.17700195 MHz (a relatively high-frequency SJ of 1/1024 times the data rate), a SJ profile amplitude of 0.212547859 UI, and a PI resolution of 0.020833333 (corresponding to a step size of 0.808080808 picoseconds at the data rate). The insertion time index increments can be converted into pico-seconds (at the data rate) by dividing an injection spacing (e.g., 16 UI) by the data rate in Megahertz, as: C=16/(0.002578125)=620.6060606. Referring to the first row, as an example, the SJ profile magnitude can be computed for insertion time '1' (and transformed into data rate clock space) as:

$PM(t)=A*\sin(2\pi*F*t*C/1000000)*(1000/DR)=$
0.212547859*sin
(2π*25.17700195*1*0.0006206060606)*1/
0.02578125=0.808080808.

The SJ introduced magnitude, IM(t−1), as of the first insertion time is 0; so the shift determination can be made by rounding [PM(t)−IM(t−1)]/S to a nearest integer:

Round [(0.808080808−0)/0.808080808]=1.

Accordingly, the accumulated PI steps after the first determination, s(1), is 1; which, multiplied by the step size, yields an IM(1) of 0.808080808 picoseconds and a IM_UI(1) of 0.020833333 UI.

Referring to the seventh row as another example, the SJ profile magnitude can be computed for insertion time '7' (and transformed into data rate clock space) as:

$PM(t)=A*\sin(2\pi*F*t*C/1000000)*(1000/DR)=$
0.212547859*sin
(2π*25.17700195*7*0.0006206060606)*1/
0.02578125=5.230116243.

The SJ introduced magnitude, IM(t−1), as of the sixth insertion time is 4.848484848; so the shift determination can be made by rounding [PM(t)−IM(t−1)]/S to a nearest integer:

Round [(5.230116243−4.848484848)/0.808080808]= 0.

Accordingly, the accumulated PI steps after the seventh determination, s(7), remains at 6; which, multiplied by the step size, yields an IM(1) of 4.848484848 picoseconds and a IM_UI(1) of 0.125 UI.

Figures 4, 5:
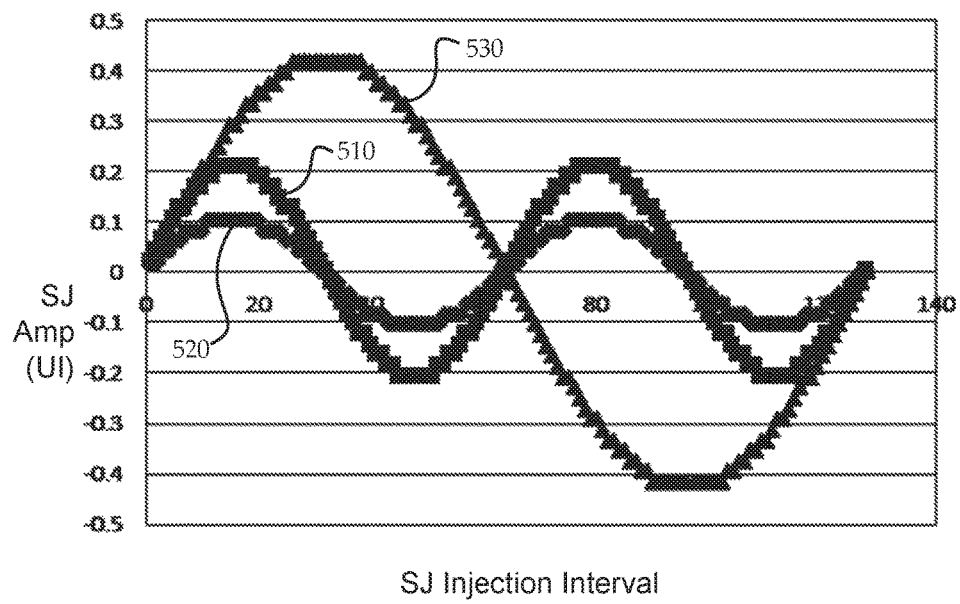
FIG. 4 shows an illustrative chart having various SJ profile parameters, PI profile parameters, and other parameters for defining three SJ profiles.
FIG. 5 shows an illustrative graph having plots corresponding to injected SJ resulting from the three different SJ profiles of FIG. 4.

FIG. 4 shows an illustrative chart 400 having various SJ profile parameters, PI profile parameters, and other parameters for defining three SJ profiles. The three illustrated SJ profiles (i.e., the three columns of the chart 400) correspond to a high-frequency, medium-amplitude jitter profile definition 410 (approximately 25 MHz and 0.21 UI), a high-frequency, low-amplitude jitter profile definition 420 (approximately 25 MHz and 0.1 UI), and a medium-frequency, high-amplitude jitter profile definition 430 (approximately 12.5 MHz and 0.42 UI). FIG. 5 shows an illustrative graph 500 having plots corresponding to injected SJ resulting from the three different SJ profiles of FIG. 4. Plot 510 corresponds to jitter profile definition 410, plot 520 corresponds to jitter profile definition 420, and plot 530 corresponds to jitter profile definition 430. The partial SJ profile illustrated in FIG. 3 corresponds to plot 510 and jitter profile definition 410.

While the above descriptions focus on SJ injection, similar techniques can be used to generate frequency offsets. For example, as described above, the SERDES includes components to track drifting clock phases and frequency offsets due to various non-idealities of the operating environment. By using the sinusoidal jitter injector (e.g., sinusoidal jitter injector 130), or a similar component, frequency offsets can effectively be generated and imposed on the SERDES. Various implementations can inject SJ and generate frequency offsets separately, concurrently, and/or in any suitable manner. When SJ is injected along with a frequency offset, implementations can include arbitration components. For example, a shift determination for SJ injection may conflict with a shift determination for frequency offset. In such implementations, the second order CDR loop can provide an effective interface for vote collision detection, and second order votes can be realigned with first order votes. Some arbitration components can further prevent particular types of conflicts, such as to prevent excessive amplitudes. For example, when using a high-frequency, high-amplitude SJ injection profile, implementations may limit SJ amplitude if frequency offsets are included.

Figure 6:
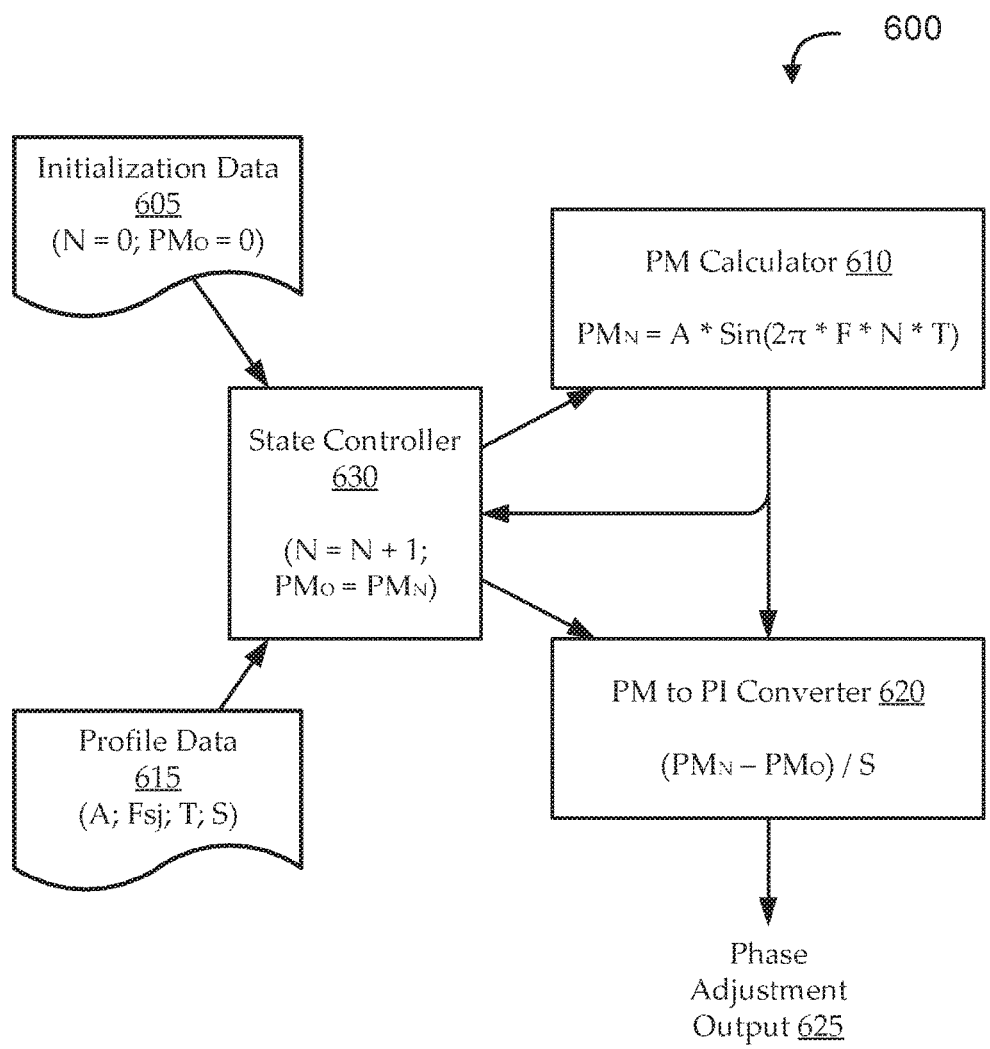
FIG. 6 shows a block diagram of an illustrative state machine for implementing built-in SJ injection in a SERDES circuit, according to various embodiments.

FIG. 6 shows a block diagram of an illustrative state machine 600 for implementing built-in sinusoidal jitter (SJ) injection in a serializer/deserializer (SERDES) circuit, according to various embodiments. The state machine 600 can be an implementation of the profile generator 137 or of the SJ injector 130 of FIG. 1 or 2. The state machine 600 includes a profile magnitude (PM) calculator 610 (i.e., corresponding to a computed total jitter), a PM to phase interpolation (PI) converter 620, and a state controller 630. The state controller 630 can control the state of the state machine 600, for example, by directing the PM calculator 610 and the PM to PI converter 620 in each of a number of iteration, and providing those components with appropriate data for each iteration. As illustrated, the state controller 630 can receive initialization data 605 and profile data 615. In some implementations, the initialization data 605 and the profile data 615 are stored in the profile data store 135 of FIG. 1 or 2. In other implementations, the initialization data 605 is stored by the state controller 630 as an initial state condition. The initialization data 605 can include an initial injection count (N) and an initial initialization data 605 prior PM ($PM_O$, representing the initial PM for the first iteration or the previous iteration in subsequent iterations). For example, the initialization data 605 can set N=1 (or N can be set to 0 and incremented to N=1 by the state controller 630 prior to the first iteration), and the initialization data 605 can set $PM_O$=0.The profile data 615 can include any SJ profile and/or PI profile data useful for components of the state machine.

The PM calculator 610 can use N and $PM_O$ from the initialization data 605; and the SJ profile amplitude (A), SJ profile frequency (F), and injection interval (T) from the profile data 615 to compute the PM for the present injection count ($PM_N$). As described above, the computation can be according to the formula: PM(t)=A*sin(2π*F*N*T). The PM to PI converter 620 can use the previous and present PM computations to generate a phase adjustment output signal 625. As illustrated, the PM to PI converter 620 can compute a shift determination for the PI according to the difference between $PM_O$ and $PM_N$, divided by a PI step size (S) received from the profile data 615 (e.g., $PM_N$−$PM_O$/S). For example, as described above, rounding the computation can yield a 0,positive integer, or negative integer result, which can be translated into a PI control code as the phase adjustment output signal 625.

Having generated the phase adjustment output signal 625 for the present iteration, the state controller 630 can update parameters for the next iteration. For example, the state controller 630 can update N to N+1 (the next injection count) and can update $PM_O$ to $PM_N$ (the PM computed for the present iteration becomes the previously computed PM in the next iteration). In some implementations, the state controller 630 includes thresholds or other protections to avoid saturation, or the like. For example, the state controller 630 can cause the N counter to roll over upon (or in anticipation of) saturation.

Figure 7:
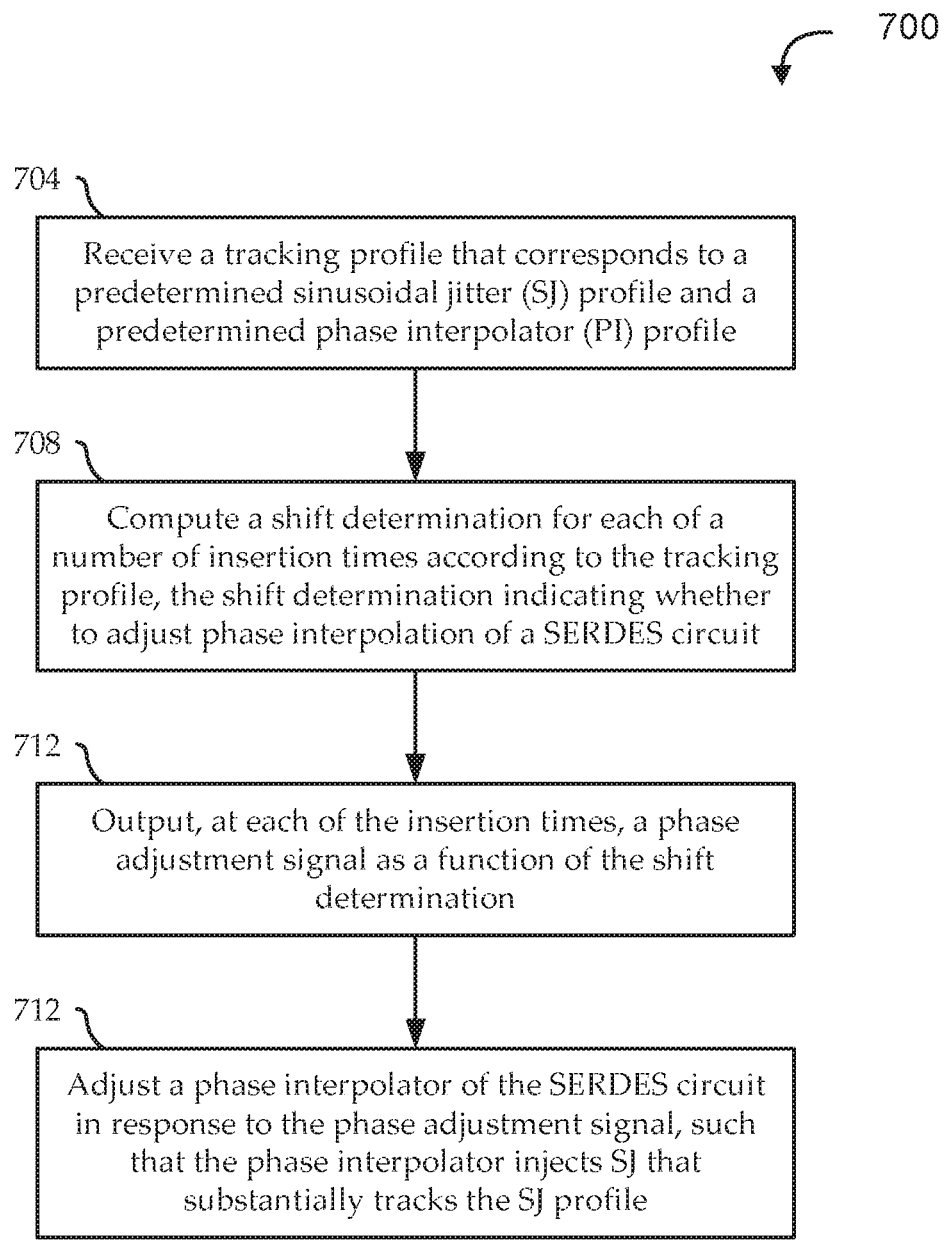
FIG. 7 shows a flow diagram of a method for built-in SJ injection in a SERDES circuit.

Further, embodiments can include methods for built-in sinusoidal jitter (SJ) injection that can be implemented on the systems described above and/or on any other suitable system. FIG. 7 shows a flow diagram of a method 700 for built-in sinusoidal jitter (SJ) injection in a serializer/deserializer (SERDES) circuit. Embodiments of the method 700 begin at stage 704 by receiving a tracking profile that corresponds to a predetermined SJ profile and a predetermined phase interpolator (PI) profile. At stage 708, embodiments can compute a shift determination for each of a number of insertion times according to the tracking profile, such that shift determination indicates whether to adjust phase interpolation of the SERDES circuit. For example, embodiments can determine, for each insertion time, whether to adjust phase interpolation of the SERDES circuit according to a tracking profile that corresponds to a predetermined SJ profile and a predetermined phase interpolator (PI) profile. The SJ profile can include a SJ profile amplitude and a SJ profile frequency; and the PI profile can include a PI step size. The tracking profile can include any additional information, such as the types of data shown in FIGS. 3 and 4. The computation at stage 708 can include computing a SJ profile magnitude at each insertion time, PM(t), as a function of the SJ profile amplitude and the SJ profile frequency. A SJ introduced magnitude IM(t−1) can then be computed as a function of the PI step size and an accumulated PI steps at previous insertion time (t−1). For each insertion time, the computing can include determining whether to increase, decrease, or maintain the phase interpolation according to whether PM(t) is greater than or less than IM(t−1) by one or more threshold amounts (e.g., defined by the tracking profile). For example, an amount of phase interpolation shift can be determined by rounding the difference between PM(t) and IM(t−1) to a nearest integer multiple of a predefined PI step size.

At stage 712, embodiments can output, at each of the insertion times, a phase adjustment signal as a function of the shift determination. In some embodiments, the phase interpolation shift is implemented by incrementing or decrementing a control code for the PI. In such embodiments, the signal generated in stage 712 can be a control signal for adjusting the PI control code, the control code itself, or any other suitable signal. In some embodiments, at stage 720, embodiments can adjust a phase interpolator of the SERDES circuit in response to the phase adjustment signal, such that the phase interpolator injects SJ that substantially tracks the SJ profile.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A method for built-in sinusoidal jitter (SJ) injection in a serializer/deserializer (SERDES) circuit, the method comprising:
   receiving a tracking profile that corresponds to a predetermined SJ profile and a predetermined phase interpolator (PI) profile;
   computing a shift determination for each of a plurality of insertion times according to the tracking profile, the shift determination indicating whether to adjust phase interpolation of the SERDES circuit; and
   outputting, at each of the plurality of insertion times, a phase adjustment signal as a function of the shift determination,
   wherein:
   the SJ profile comprises a SJ profile amplitude and a SJ profile frequency;
   the PI profile comprises a PI step size; and
   said computing the shift determination comprises, for each insertion time (t):
      computing a SJ profile magnitude, PM(t), as a function of the SJ profile amplitude and the SJ profile frequency;
      computing a SJ introduced magnitude IM(t−1) as a function of the PI step size and an accumulated PI steps at previous insertion time (t−1);
      determining to increase the phase interpolation according to whether PM(t) exceeds IM(t−1) by at least an increase threshold according to the tracking profile; and
      determining to decrease the phase interpolation according to whether IM(t−1) exceeds PM(t) by at least a decrease threshold according to the tracking profile.

2. The method of claim 1, further comprising:
   adjusting a phase interpolator of the SERDES circuit in response to the phase adjustment signal, such that the phase interpolator injects SJ that substantially tracks the SJ profile.

3. The method of claim 1, further comprising:
   adjusting a phase interpolator of the SERDES circuit in response to the phase adjustment signal by:
      incrementing a PI code in response to determining to increase the phase interpolation; and
      decrementing a PI code in response to determining to decrease the phase interpolation.

4. The method of claim 1, wherein said computing the SJ profile magnitude is according to: $PM(t)=A*\sin(2\pi*F*t)$, where A is the SJ profile amplitude, and F is the SJ profile frequency.

5. The method of claim 1, wherein:
said computing the SJ introduced magnitude is according to: $IM(t-1)=S*s(t-1)$, where S is the PI step size, and $s(t-1)$ is the accumulated PI steps at insertion time $(t-1)$; and
said computing the shift determination further comprises rounding, to a nearest integer, $[PM(t)-IM(t-1)]/S$,
such that the phase interpolation is increased when the nearest integer is positive, and the phase interpolation is decreased when the nearest integer is negative.

6. A system for sinusoidal jitter (SJ) injection, the system comprising:
a state controller comprising a state parameter output comprising a SJ profile amplitude, a SJ profile frequency, a phase interpolator (PI) step size, an injection interval, a present injection count, and a previously computed profile magnitude ($PM_O$);
a profile magnitude (PM) calculator comprising:
a first state input coupled to the state parameter output; and
a $PM_N$ output computed as a function of the SJ profile amplitude, the SJ profile frequency, the injection interval, and the present injection count; and
a PM to PI converter comprising:
a second state input coupled to the state parameter output;
a $PM_N$ input coupled to the $PM_N$ output; and
a phase adjustment output computed as a function of the $PM_N$ input, the $PM_O$, and the PI step size.

7. The system of claim 6, further comprising:
a profile data store having, stored thereon, a SJ profile and a phase interpolator (PI) profile, the SJ profile defining the SJ profile amplitude and the SJ profile frequency, and the PI profile defining the PI step size,
wherein the state controller further has a profile input coupled with the profile store.

8. The system of claim 6, wherein, prior to each of a plurality of iterations:
the state controller increments the present injection count and sets the PMo according to the PMN output.

9. The system of claim 6, wherein the phase adjustment output, when couple with a phase interpolator that is coupled with a clock signal, causes the phase interpolator to inject SJ into the clock signal, such that the injected SJ substantially tracks the SJ profile amplitude and the SJ profile frequency.

10. The system of claim 6, wherein the $PM_N$ output is computed according to:
$PM_N=A*\sin(2\pi*F*N*T)$,
where A is the SJ profile amplitude, F is the SJ profile frequency, N is the present injection count, and T is the injection interval.

11. The system of claim 6, wherein the phase adjustment output is computed as a function of a ratio between a marginal PM and the PI step size, the marginal PM corresponding to a difference between the $PM_N$ and the $PM_O$.

12. The system of claim 6, wherein:
the phase adjustment output is generated to indicate an increase in phase interpolation when $PM_N$ exceeds $PM_O$ by at least an increase threshold relating to the PI step size;
the phase adjustment output is generated to indicate a decrease in the phase interpolation when $PM_O$ exceeds $PM_N$ by at least a decrease threshold relating to the PI step size; and
the phase adjustment output is generated to indicate no change in the phase interpolation otherwise.

13. The system of claim 6, further comprising:
a state machine comprising the state controller, the PM calculator, and the PM to PI converter.

14. The system of claim 6, further comprising:
a serializer/deserializer (SERDES) circuit having a phase interpolator and a built-in SJ injector,
wherein the built-in SJ injector comprises the state controller, the PM calculator, and the PM to PI converter, and the phase interpolator is controlled according at least to the phase adjustment output.

15. The system of claim 14, wherein the SERDES circuit comprises:
a transmitter system having a transmitter-side phase interpolator; and
a receiver system having a receiver-side phase interpolator,
wherein the built-in SJ injector is selectively couplable with the transmitter-side phase interpolator and the receiver-side phase interpolator.

16. The system of claim 14, wherein the SERDES circuit comprises:
a transmitter system having a transmitter-side phase interpolator coupled with a first instance of the built-in SJ injector; and
a receiver system having a receiver-side phase interpolator coupled with a second instance of the built-in SJ injector.

17. A processor comprising:
means for computing a profile magnitude PMN for each of a plurality of iterations as a function of a sinusoidal jitter (SJ) profile amplitude, a SJ profile frequency, and an injection increment, the injection increment corresponding to an injection interval, and a present injection count for the iteration; and
means for generating a phase adjustment output for each of the plurality of iterations as a function of the $PM_N$, a phase magnitude computed in a previous iteration $PM_O$, and a phase interpolator (PI) step size.

18. The processor of claim 17, further comprising:
a profile data store having, stored thereon, the SJ profile amplitude, the SJ profile frequency, and the PI step size.

19. The processor of claim 17, wherein the phase adjustment output, when coupled with a phase interpolator that is coupled with a clock signal, causes the phase interpolator to inject SJ into the clock signal, such that the injected SJ substantially tracks the SJ profile amplitude and the SJ profile frequency.

* * * * *

UNITED STATES PATENT AND TRADEMARK OFFICE
CERTIFICATE OF CORRECTION

PATENT NO. : 10,084,591 B1  
APPLICATION NO. : 15/464972  
DATED : September 25, 2018  
INVENTOR(S) : Palusa et al.

Page 1 of 1

It is certified that error appears in the above-identified patent and that said Letters Patent is hereby corrected as shown below:

In the Specification

In Column 3, Line 44, delete "effectifely" and insert -- effectively --, therefor.

In Column 7, Line 55, delete "Si" and insert -- SJ --, therefor.

In Column 10, Line 10, delete "=0.The" and insert -- =0. The --, therefor.

In Column 10, Line 27, delete "0,positive" and insert -- 0, positive --, therefor.

In the Claims

In Column 13, Line 42, in Claim 8, delete "PMo" and insert -- $PM_o$ --, therefor.

In Column 13, Line 42, in Claim 8, delete "PMN" and insert -- $PM_N$ --, therefor.

In Column 14, Line 38, in Claim 17, delete "PMN" and insert -- $PM_N$ --, therefor.

Signed and Sealed this  
Thirty-first Day of December, 2019

Andrei Iancu  
*Director of the United States Patent and Trademark Office*